(12) United States Patent
Sasaoka

(10) Patent No.: US 8,441,029 B2
(45) Date of Patent: May 14, 2013

(54) LIGHT EMITTING ELEMENT INCLUDING SIDE SURFACE DIELECTRIC LAYER FOR AVOIDING IMPURITY ADHESION

(75) Inventor: Chiaki Sasaoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 147 days.

(21) Appl. No.: 13/011,592

(22) Filed: Jan. 21, 2011

(65) Prior Publication Data

US 2011/0180838 A1 Jul. 28, 2011

(30) Foreign Application Priority Data

Jan. 25, 2010 (JP) ................................. 2010-013305

(51) Int. Cl.
*H01L 33/00* (2010.01)
(52) U.S. Cl.
USPC ........ 257/99; 257/103; 257/76; 257/E33.013; 438/22; 438/73; 438/106; 438/488
(58) Field of Classification Search .............. 257/99, 257/103, 76, E33.013; 438/478, 22, 106, 438/488
See application file for complete search history.

(56) References Cited

U.S. PATENT DOCUMENTS

| | | | |
|---|---|---|---|
| 6,991,952 B2 | 1/2006 | Mizuno et al. | |
| 7,164,148 B2 | 1/2007 | Yoshida et al. | |
| 7,238,076 B2 | 7/2007 | Yoshida et al. | |
| 7,646,798 B2 | 1/2010 | Michiue et al. | |
| 7,790,484 B2 | 9/2010 | Ishida et al. | |
| 2004/0087048 A1 | 5/2004 | Mizuno et al. | |
| 2005/0153478 A1 | 7/2005 | Yoshida et al. | |
| 2005/0212099 A1* | 9/2005 | Lee et al. ...................... | 257/666 |
| 2005/0242359 A1 | 11/2005 | Yoshida et al. | |
| 2008/0181274 A1* | 7/2008 | Michiue et al. .......... | 372/44.011 |
| 2008/0309218 A1* | 12/2008 | Kamikawa et al. ........... | 313/498 |
| 2010/0044718 A1* | 2/2010 | Hanser et al. .................. | 257/76 |

FOREIGN PATENT DOCUMENTS

| | | |
|---|---|---|
| JP | 2004-040051 | 2/2004 |
| JP | 2004-273908 | 9/2004 |
| JP | 2004-289010 | 10/2004 |
| JP | 2006-344727 | 12/2006 |
| JP | 2008-182208 | 8/2008 |

* cited by examiner

*Primary Examiner* — Evan Pert
*Assistant Examiner* — Mark A Laurenzi
(74) *Attorney, Agent, or Firm* — Young & Thompson

(57) ABSTRACT

To suppress adhesion of impurities to a semiconductor light emitting element, there is provided a nitride-based semiconductor light emitting element including: a laminated body having a first cladding layer, an active layer formed over the first cladding layer, and a second cladding layer formed over the active layer; and a dielectric film with a thickness of 3 μm or more that is formed on the side surface of the laminated body on the side where light is emitted and that covers at least a first side surface of the active layer.

4 Claims, 5 Drawing Sheets

LIGHT EMITTING ELEMENT INCLUDING SIDE SURFACE DIELECTRIC LAYER FOR AVOIDING IMPURITY ADHESION

CROSS-REFERENCE TO RELATED APPLICATIONS

The disclosure of Japanese Patent Application No. 2010-13305 filed on Jan. 25, 2010 including the specification, drawings and abstract is incorporated herein by reference in its entirety.

BACKGROUND

1. Field of the Invention

The present invention relates to a nitride-based semiconductor light emitting element and a light emitting device in which the nitride-based light emitting element is mounted in the package.

2. Description of Related Art

Because highly efficient blue-violet emission can be obtained from group III nitride semiconductors represented by gallium nitride, the semiconductors have attracted attentions as materials for Light Emitting Diodes (LEDs) and Laser Diodes (LDs). Among them, the LD with a wavelength of 405 nm is expected as a light source for an optical disk apparatus with a large capacity, because the beam of the LD can be more narrowed than the conventional LD with a wavelength of 650 nm. In recent years, with the spread of big-screen TVs, etc., there is an increasing demand for blue-violet reproducing LDs in order to reproduce high-quality moving images.

The structure of a typical nitride-based semiconductor light emitting element (semiconductor laser) is illustrated in FIG. 7. The nitride-based semiconductor light emitting element has a lamination structure in which an n-type cladding layer 102, an optical guide layer 103, an active layer 104, an optical guide layer 105, and a p-type cladding layer 106 are laminated on a GaN substrate 101 in this order. The p-type cladding layer 106 is processed into a ridge shape. The top of the ridge is covered with an insulating film 107 having a stripe-shaped aperture in which a p-type electrode 108 is provided. A current blocking structure is formed by a stripe-shaped electrode and the transverse mode is controlled by adjusting the width and height of the ridge. A laser beam is radiated from a resonator mirror (not illustrated) formed by cleavage.

A dielectric film (not illustrated) is formed, as an end-surface protective film, on the resonator mirror formed by cleavage. As end-surface protective films for the blue-violet semiconductor laser with a wavelength of 405 nm, for example, an Anti-reflecting (AR) film composed of an $Al_2O_3$ single layer is provided on the surface on the side where a laser beam is radiated, and a High-reflecting (HR) film composed of a multilayer film such as $Al_2O_3/TiO_2$, is provided on the surface opposite to the forgoing surface. With such a configuration, the surface of the semiconductor is protected and the oscillation threshold current is reduced, thereby allowing a lease beam to be efficiently radiated from the surface on which the AR film is provided.

The semiconductor light emitting element thus manufactured is enclosed in a CAN package to be easily incorporated into an optical pickup device. Specifically, after the semiconductor light emitting element has been fusion-bonded to a heatsink followed by fusion bonding thereof to a stem, the stem is enclosed with a cap having a glass window. With such a package, it can be prevented that the semiconductor light emitting element may be damaged during assembly work, and it becomes possible that the heat radiation property during a light emitting operation is secured to stably operate the semiconductor light emitting element.

Herein, the oscillation wavelength of a blue-violet semiconductor light emitting element is as short as 405 nm and the photon energy of the laser beam is as high as 3.0 eV. Therefore, there arises the problem that organic matters remaining in the atmosphere are chemically degraded by the light emitted by the semiconductor light emitting element, and accordingly impurities such as carbon, silicon, or the like, adhere to the surface of the semiconductor light emitting element on the side where light is radiated.

Accordingly, Japanese Unexamined Patent Publication No. 2004-289010 describes a light emitting device in which adhesion of impurities to a semiconductor light emitting element can be suppressed by restricting the vapor pressure of the silicon organic compound gases in a CAN package.

Also, Japanese Unexamined Patent Publication No. 2006-344727 describes a method of manufacturing a laser device in which adhesion of impurities to a semiconductor light emitting element during a light emitting operation is suppressed with the organic gases in the CAN package being degraded and annihilated by radiating the light with a wavelength of 420 nm or less into the CAN package, while the CAN package into which the semiconductor light emitting element has been enclosed is being heated to 70° C. or higher.

Also, Japanese Unexamined Patent Publication No. 2004-40051 describes a technique in which a semiconductor light emitting element is enclosed in the CAN package after organic matters have been eliminated by radiating ultraviolet light or plasma onto a semiconductor light emitting element support member. Also, Japanese Unexamined Patent Publication No. 2004-273908 describes a technique in which ultraviolet light is radiated into the CAN package after a semiconductor light emitting element has been enclosed in the CAN package under an ozone atmosphere.

Also, Japanese Unexamined Patent Publication No. 2008-182208 describes a technique regarding a nitride-based semiconductor light emitting element.

SUMMARY

Although a CAN package is effective in achieving an stable operation of laser, it has a disadvantage in terms of coat, for example, the necessity of a cap having a glass window. Accordingly, cheap frame packages are the mainstream in red and infrared lasers to be used in optical disk applications. A frame package has a configuration in which a semiconductor light emitting element is attached to a flat support member, and the frame package can be manufactured without a glass cap and a welding process for enclosure. Accordingly, the frame package is suitable for reducing cost in terms of component and process costs.

It is believed that a drastic reduction in the cost can be achieved by applying the frame package to a blue-violet semiconductor light emitting device.

Even when a semiconductor light emitting element is to be mounted in such a package, it is needed to solve the problem that organic matters remaining in the atmosphere may be chemically degraded by the light emitted by the semiconductor light emitting element to adhere thereto.

However, any one of the above-mentioned four patent documents discloses a technique in which adhesion of impurities to a semiconductor light emitting element that has been enclosed in a CAN package is suppressed, and accordingly it cannot suppress the adhesion of impurities to a semiconductor light emitting element when a frame package is applied.

A frame package is greatly different from a CAN package in that the semiconductor light emitting element is exposed to the air. Accordingly, adhesion of impurities to the semiconductor light emitting element occurs due to the organic compound gases in the air, and hence the adhesion of impurities to the semiconductor light emitting element cannot be suppressed even by cleaning the package components.

According to an aspect of the present invention, a nitride-based semiconductor light emitting element includes: a laminated body including a first cladding layer, an active layer formed over the first cladding layer, and a second cladding layer formed over the active layer; and a dielectric film with a thickness of 3 μm or more that is formed on the side surface of the laminated body on the side where light is emitted and that covers at least a first side surface of the active layer.

Because the photon energy of a blue-violet semiconductor light emitting element is high, silicon organic compounds in the atmosphere, such as siloxane, are photochemically degraded by the light emitted by the semiconductor light emitting element to become impurities such as $SiO_2$, so that the impurities adhere to the semiconductor light emitting element, in particular, to the light-radiating surface thereof.

In Japanese Unexamined Patent Publication No. 2004-289010, it is described that the reaction rate of a photochemical degradation into $SiO_2$, etc., is proportional to approximately the square of a light intensity (light density) and that the photochemical degradation reactions is a two-photon process involving two photons. Herein, because the light radiated from the active layer of a semiconductor light emitting element is radiated so as to have a certain angle, the light intensity thereof becomes weaker as going away from the first side surface of the active layer. That is, the above photochemical degradation reaction is most likely to occur on the light-radiating surface of the semiconductor light emitting element, i.e., on the surface that is in contact with the atmosphere gases on the side where the light is radiated. In the present invention, the light intensity on the light-radiating surface is reduced by the aforementioned configuration.

In the case of the nitride-based semiconductor light emitting element according to the present invention, the surface exposed to the atmosphere of the dielectric film becomes the light-radiating surface. Because the light intensity of the light radiated from the active layer becomes weaker, traveling farther through the dielectric film, the light intensity on the exposed surface (light-radiating surface) of the dielectric layer can be drastically reduced when the thickness of the dielectric film is made thicker.

In such a case, it can be suppressed that silicon organic compounds in the atmosphere, such as siloxane, may be photochemically degraded by the light radiated from the semiconductor light emitting element, and accordingly it can be suppressed that impurities may adhere to the semiconductor light emitting element, in particular, to the light-radiating surface thereof.

According to the present invention, it becomes possible that adhesion of impurities to a semiconductor light emitting element is suppressed.

DETAILED DESCRIPTION OF THE PREFERRED EMBODIMENTS

Figure 1:
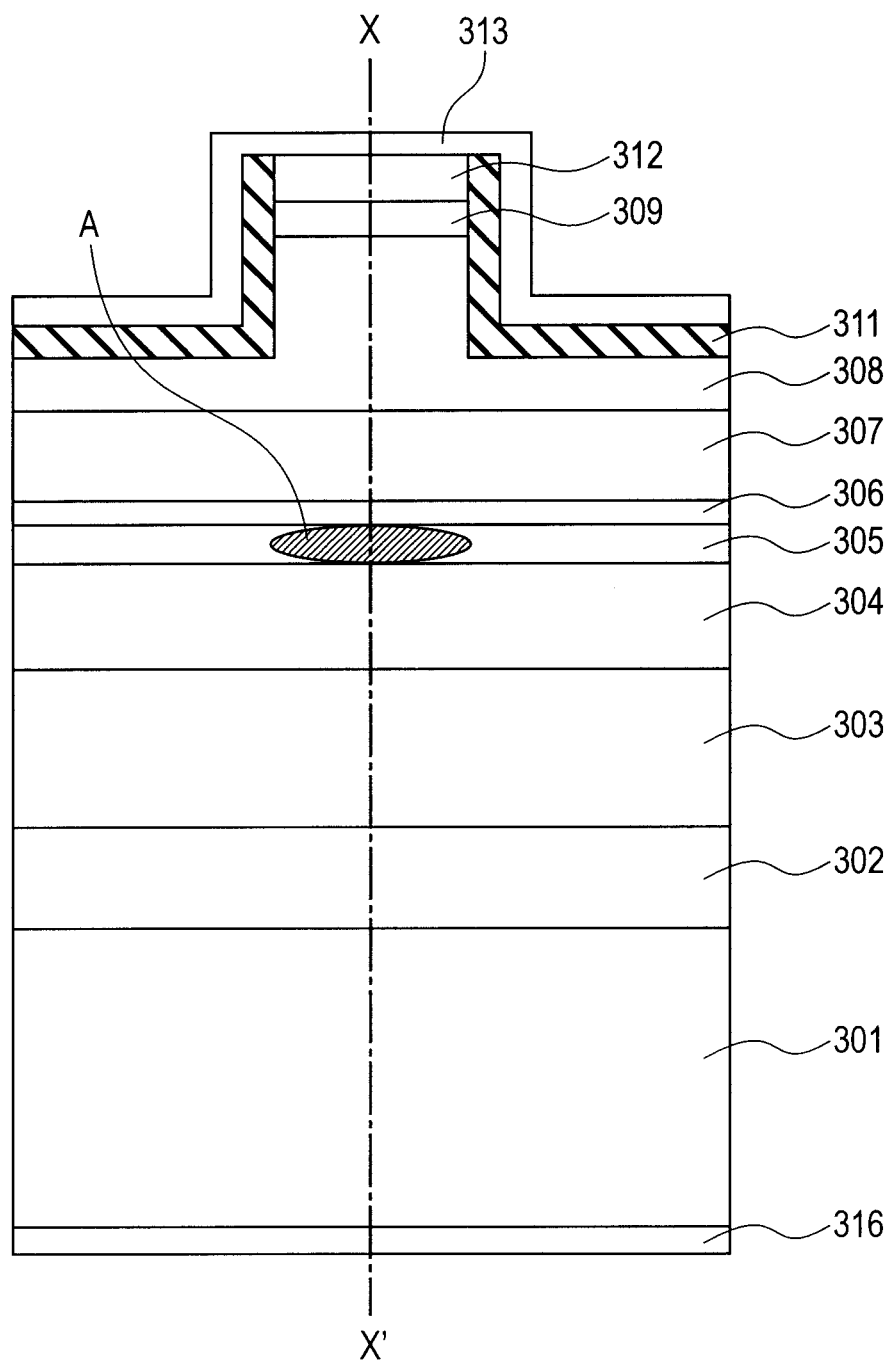
FIG. 1 is a sectional view schematically illustrating an example of a nitride-based semiconductor light emitting element according to the present embodiment.

Embodiments of the present invention will now be described with reference to accompanying drawings. The same constituent elements are denoted with the same reference numerals in all the drawings, and some descriptions will not be repeated.

Embodiment

Figure 2:
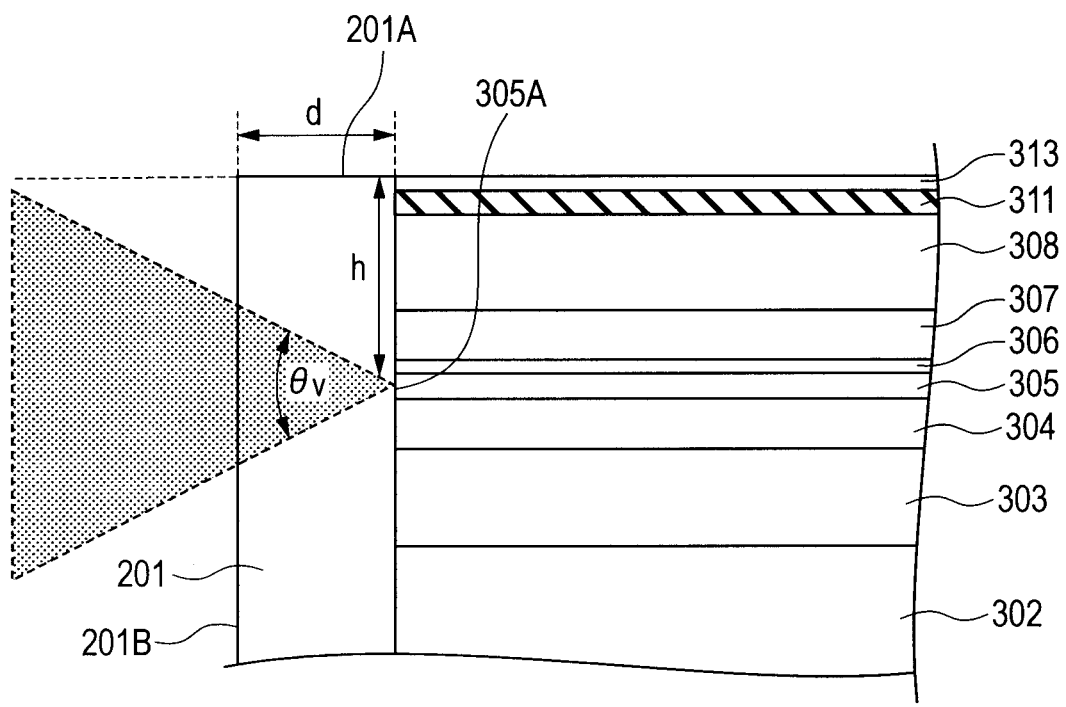
FIG. 2 is a sectional view schematically illustrating an example of part of the nitride-based semiconductor light emitting element according to the embodiment.

FIGS. 1 and 2 illustrate a case where a nitride-based semiconductor light emitting element according to the present embodiment is applied to a semiconductor laser as an example. FIG. 1 is a sectional view schematically illustrating an example of the nitride-based semiconductor light emitting element according to the present embodiment. Light is radiated on the near side in the direction perpendicular to the plane in FIG. 1. FIG. 2 is a sectional view schematically illustrating part of the section, taken along the X-X' line of the nitride-based semiconductor light emitting element in FIG. 1. In the view, light is radiated from right to left.

As illustrated in FIG. 1, the nitride-based semiconductor light emitting element according to the present embodiment has a laminated body including a first cladding layer 303, an active layer 305 formed over the first cladding layer 303, and a second cladding layer 308 formed over the active layer 305.

In the active layer 305, the injected electron and the hole are recombined to emit light. The first cladding layer 303 and the second cladding layer 308 have a function of increasing the electron density and hole density of the active layer 305. In the preset embodiment, the configuration of the first cladding layer 303, the active layer 305, and the second cladding layer 308 is not particularly limited. For example, the first cladding layer 303 may be an Si-doped $Al_{X1}Ga_{Y1}N$ layer (example: Si concentration of $4\times10^{17}$ $cm^{-3}$, thickness of 2 μm). The active layer 305 may be a three-cycle multiple quantum well (MQW) active layer composed of an $In_{X2}Ga_{Y2}N$ (example: thickness of 3 nm) well layer and Si-doped $In_{X3}Ga_{Y3}N$ (example: Si concentration of $1\times10^{18}$ $cm^{-3}$, thickness of 4 nm) barrier layer. The second cladding layer 308 may be a p-type $Al_{X4}Ga_{Y4}N$ layer (example: thickness of 0.8 μm).

The laminated body including the first cladding layer 303, the active layer 305, and the second cladding layer 308 may be formed on, for example, an n-type GaN substrate 301, as illustrated in FIG. 1. The laminated body may have a structure in which an Si-doped n-type GaN layer 302, the first cladding layer 303, an n-type GaN optical confinement layer 304, the active layer 305, a cap layer 306, a p-type GaN optical confinement layer 307, the second cladding layer 308, a p-type GaN contact layer 309, and a p-contact 312 composed of Pd/Pt, are laminated in this order.

In the second cladding layer 308 and the p-type GaN contact layer 309, a ridge structure made by using dry etching is formed into a stripe shape. A p-type electrode 313 is provided over the p-type GaN contact layer 309 on the top of the ridge structure, and an n-type electrode 316 is provided under the n-type GaN substrate 301, respectively.

As illustrated in FIG. 2, the nitride-based semiconductor light emitting element according to the present embodiment has a dielectric film 201 that is formed on the side surface (left side surface in FIG. 2) of the laminated body including the first cladding layer 303, the active layer 305, and the second cladding layer 308, light being radiated from the side surface, and that covers at least a first side surface 305A of the active layer 305.

The thickness d of the dielectric film 201 is greater than or equal to 3 μm. The maximum of the thickness d thereof may be smaller than or equal to h·cot ($\theta_r/2$), assuming that the distance from the upper side of the first side surface 305A of the active layer 305 (the side extending in the direction perpendicular to the plane of FIG. 2) to the top of the side surface 201A of the dielectric film 201, in the direction approximately perpendicular to the active layer 305, is h, and the radiation angle of the light radiated from the first side surface 305A of the active layer 305 in the direction approximately perpendicular to the active layer 305, is $\theta_r$. That is, the thickness d of the dielectric film 201 may be 3 μm≦d≦h·cot ($\theta_r/2$).

The dielectric film 201 may be made of any material as far as it does not absorb light and is not degraded by light, in particular, the light radiated by the semiconductor light emitting element. And, it is desirable that the material never peels and cracks when the thickness of the film is made large. For example, the dielectric film 201 may be: a film composed of any one of $Al_2O_3$, $SiO_2$, $TiO_2$, $ZrO_2$, $Ta_2O_5$, $Nb_2O_5$, $MgF_2$, $CaF_2$, AlN, and $Si_3N_4$, each of which is formed by sputtering, deposition, CVD (Chemical Vapor Deposition), or the like, or of a silicone resin attached by potting or ink-jet; or a multilayer film combining two or more of the foregoing films. It is desirable that the dielectric film 201 has an end-surface reflectance to a laser beam of 1 to 30%, and the dielectric film 201 having a predetermined refractive index can be stably formed by appropriately combining films composed of the aforementioned materials.

Alternatively, the HR film (not illustrated) may be formed on the surface opposite to the surface (surface on the left side in FIG. 2) on the side where the light of the laminated body including the first cladding layer 303, the active layer 305, and the second cladding layer 308, is radiated. The HR film can be a multilayer film combining a dielectric film with a low refractive index and that with a high refractive index, and it is desirable to make the HR film have a reflectance to a laser beam of 70 to 99%. The HR film can be composed of: an oxide such as $Al_2O_3$, $SiO_2$, $TiO_2$, $ZrO_2$, $Ta_2O_5$, $Nb_2O_5$, or the like, a fluoride such as $MgF_2$, $CaF_2$, or the like, a nitride such as AlN, $Si_3N_4$, or the like, all of which can be formed by sputtering, deposition, CVD, or the like; or an organic film such as a silicone resin, or the like.

A method of manufacturing such the nitride-based semiconductor light emitting element according to the present embodiment is not particularly limited, but can be achieved by using all conventional techniques.

For example, the nitride-based semiconductor light emitting element can be manufactured: by forming, on a substrate, a laminated body including the first cladding layer 303, the active layer 305 formed over the first cladding layer 303, and the second cladding layer 308 formed over the active layer 305, by using a growth system, for example, an MOVPE (Metal-Organic Vapor Phase Epitaxy) system, or the like; and thereafter by forming the dielectric film 201 having a predetermined thickness on the surface of the laminated body on the side where light is radiated by using, for example, a vacuum deposition method or sputtering method.

Thereafter, the nitride-based semiconductor light emitting element can be mounted in all packages such as a frame package and a CAN package using a conventional technique.

Subsequently, operational effects of the nitride-based semiconductor light emitting element according to the present embodiment will be described.

As a result of various investigations by the present inventors with respect to a nitride-based semiconductor light emitting element (hereinafter, sometimes simply referred to as a "semiconductor light emitting element"), it has been found that adhesion of impurities to a semiconductor light emitting element, in particular, to the surface of the semiconductor light emitting element on the side where light is radiated (hereinafter, referred to as a "light-radiating surface") can be suppressed by making the dielectric film 201 thick.

Figure 3:
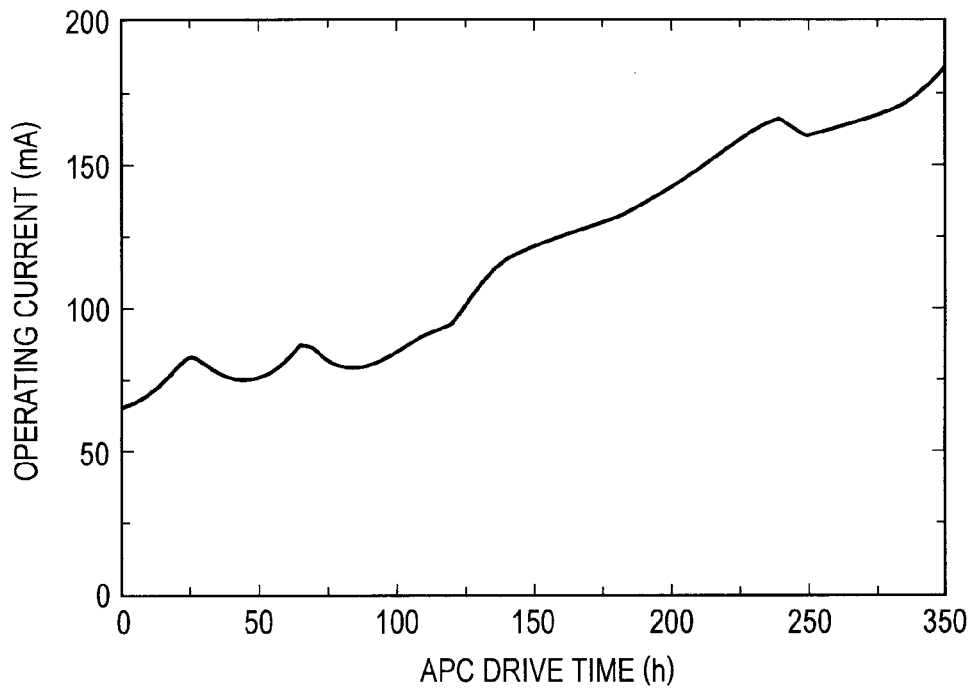
FIG. 3 is a graph illustrating a change in an operating current in the APC test of a blue-violet laser mounted in a frame package.

As stated above, because the photon energy of a blue-violet semiconductor light emitting element is high, silicon organic compounds in the atmosphere, such as siloxane, are photochemically degraded by the light in the long-term light emission to become impurities such as $SiO_2$, so that the impurities adhere to the semiconductor light emitting element, in particular, to the light-radiating surface thereof. As a result, the reflectance of the light-radiating surface varies with the adhesion of the impurities, thereby causing a phenomenon in which a drive current varies, as illustrated in FIG. 3.

According to Japanese Unexamined Patent Publication No. 2004-289010, it is described that the reaction rate of a photochemical degradation into $SiO_2$, etc., is proportional to approximately the square of a light intensity (light density) and that the photochemical degradation reactions is a two-photon process involving two photons. Herein, because the light radiated from the active layer 305 of a semiconductor light emitting element is radiated so as to have a certain angle, the light intensity thereof becomes weaker as going away from the first side surface 305A of the active layer 305. That is, the above photochemical degradation reaction is most likely to occur on the light-radiating surface of the semiconductor light emitting element, i.e., on the surface that is in contact with the atmosphere gases on the side where the light is radiated. In the semiconductor light emitting element according to the present embodiment, the light intensity on the light-radiating surface can be reduced.

Herein, it should be noted that the surface 201B of the dielectric film 201 (see FIG. 2), which is exposed to the atmosphere, is the light-radiating surface in the present embodiment.

As stated above, because the light radiated from the active layer 305 of the semiconductor light emitting element is radiated so as to have a certain angle, the light intensity thereof becomes weaker as going away from the first side surface 305A of the active layer 305. That is, the light intensity on the exposed surface (light-radiating surface) 201B can be drastically reduced when the thickness of the dielectric film 201 is made larger. In such a case, it can be suppressed that silicon organic compounds in the atmosphere, such as siloxane, may be photochemically degraded by the light radiated by the semiconductor light emitting element, and accordingly it can be suppressed that impurities may adhere to the semiconductor light emitting element, in particular, to the light-radiating surface thereof.

Hereinafter, the operational effects of the present embodiment will be described in detail, taking a blue-violet laser as an example.

As illustrated in FIG. 1, light is radiated from an extremely narrow ellipse area (ellipse A) on the side surface (the surface illustrated in FIG. 2) of the laminated body on the side where light is radiated, the laminated body including the first cladding layer 303, the active layer 305, and the second cladding layer 308. The major axis of the ellipse A is parallel to the active layer 305 and the size thereof is almost equal to the width th of the current blocking structure. The minor axis of the ellipse A is perpendicular to the active layer 305 and the size thereof is almost equal to the thickness tv of the active layer 305.

The blue-violet laser used in an optical disk application typically has th of 1 to 3 μm and tv of 0.1 to 0.2 μm in consideration of the collection efficiency, etc., in an optical pickup device.

The light radiated from the active layer 305 is radiated so as to have certain angles both in the direction perpendicular to the active layer 305 (vertical direction in FIG. 2) and in the direction parallel thereto (direction perpendicular to the plane of FIG. 2), respectively. That is, the radiated light is propagated while spreading through the dielectric film 201. In the case of a blue-violet laser, the typical radiation angle in the vertical direction is within a range of 15° to 25° (inclusive) and that in the horizontal direction is within a range of 7° to 10° (inclusive).

In such a case, the light intensity (light density) on the exposed surface (light-radiating surface) 201B of the semiconductor light emitting element becomes a function of the thickness of the dielectric film 201. Specifically, assuming that: the laser light area on the side surface (surface illustrated in FIG. 1) of the laminated body on the side where light is radiated is $S_0$, the laminated body including the first cladding layer 303, the active layer 305, and the second cladding layer 308; and the laser light area on the exposed surface (light-radiating surface) 201B of the dielectric film 201 is $S_1$, $S_0/S_1$ is equivalent to the standardized light density on the exposed surface (light-radiating surface) 201B.

The laser light area $S_0$ is represented by the following equation (1), assuming that it is an ellipse with axes of th (μm) and tv (μm):

$$S_0 = t_h \times t_v \times \pi/4 \quad (1)$$

On the other hand, the laser light area $S_1$ is represented by the following equation (2), assuming that the thickness of the dielectric film 201 is d (μm) and the vertical and horizontal radiation angles are $\theta_v$ and $\theta_h$, respectively:

$$S_1 = \left\{ d \times \tan(\theta_v/2) + \frac{t_v}{2} \right\} \times \left\{ d \times \tan(\theta_h/2) + \frac{t_h}{2} \right\} \times \pi \quad (2)$$

Figure 4:
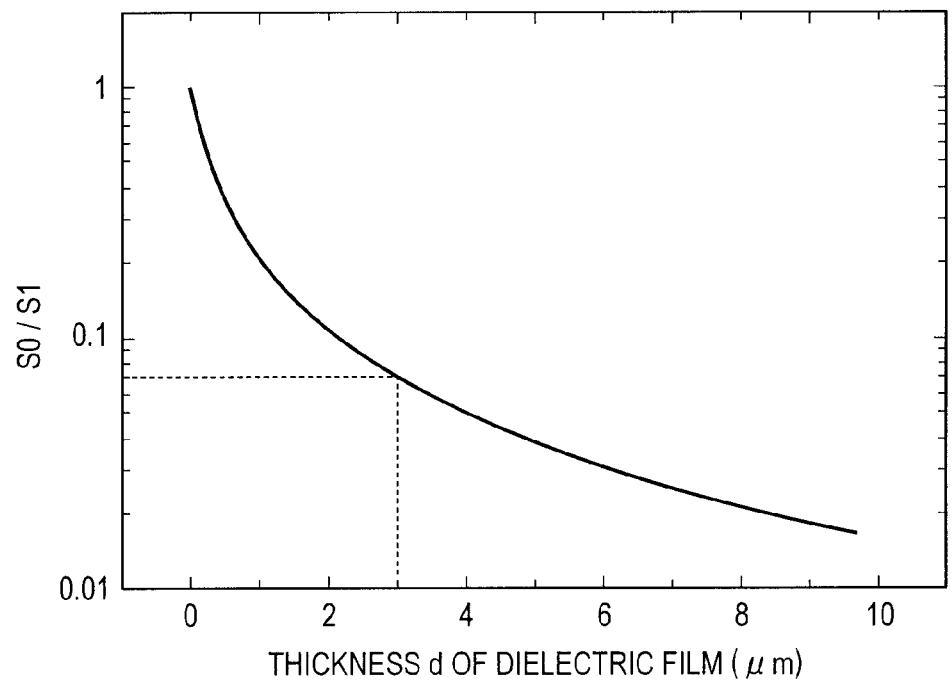
FIG. 4 is a graph illustrating the dielectric film thickness-dependency of the standardized light density: $S_0/S_1$ on the dielectric film.

Herein, when the vertical radiation angle is 20° and the horizontal one is 9°, the relationship between $S_0/S_1$ and the thickness d (μm) of the dielectric film is illustrated in FIG. 4. As learned from FIG. 4, the light density on the surface of the semiconductor light emitting element, which is in contact with the atmosphere gases, can be reduced to one-tenth or less of that occurring when the dielectric film 201 is not provided (d=0, $S_0=S_1$), by making the thickness d of the dielectric film 201 to be 3 μm or more. That is, the rate of the photochemical degradation can be reduced to one-hundredth or less.

Subsequently, the operational effects, occurring by making the thickness of the dielectric film 201 to be h·cot ($\theta_v/2$) or less, will be described.

If the thickness of the dielectric film 201 is too large, the light radiated so as to have a certain angle in the direction perpendicular to the active layer 305 (vertical direction in FIG. 2) is radiated not only from the exposed surface (light-radiating surface) 201B but also from the side surface 201A on the top of the dielectric film 201. Therefore, a disturbance arises in the radiation pattern.

In the semiconductor light emitting element according to the present embodiment, it can be avoided that the light radiated from the active layer 305 may be radiated from the side surface 201A on the top of the dielectric film 201 by making the thickness of the dielectric film 201 to be h·cot ($\theta_v/2$) or less.

According to the nitride-based semiconductor light emitting element of the present embodiment as stated above, it can be suppressed that impurities may adhere to the nitride-based semiconductor light emitting element, in particular, to the light-radiating surface thereof, even when the nitride-based semiconductor light emitting element is used in a state of being exposed to the air. That is, even when a package in which the nitride-based semiconductor light emitting element according to the embodiment is exposed to the air, for example, a frame package, is applied, it can be suppressed that impurities may adhere to the nitride-based semiconductor light emitting element, in particular, to the light-radiating surface thereof.

The nitride-based semiconductor light emitting element according to the present embodiment naturally has the same advantage as stated above even when a CAN package is applied. In such a case, it is not necessary to perform a treatment of removing or reducing the organic gases in the CAN package, and hence packaging can be efficiently performed.

EXAMPLES

A ridge-stripe laser will be described as the first example of the present embodiment.
<<Manufacture of Nitride-Based Semiconductor Light Emitting Element>>

FIGS. 5A to 5F illustrate the process drawings for manufacturing the nitride-based semiconductor light emitting element according to the present embodiment.

An n-type GaN (0001) substrate was used as a substrate. A 300-hPa decompression MOVPE system was used for manufacturing an element structure. A mixed gas of hydrogen and nitrogen was used as a carrier gas. And, trimethylgallium (TMG), trimethylaluminum (TMAl), and trimethylindium (TMI) were used as Ga, Al, and In sources, respectively; and silane ($SiH_4$) and bis(cyclopentadienyl)magnesium ($Cp_2Mg$) were used as an n-type dopant and p-type dopant, respectively.

Figure 5A:
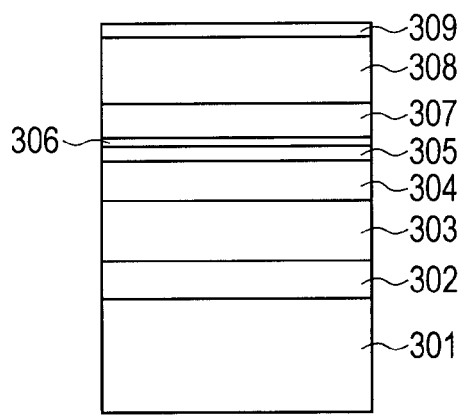
FIGS. 5A to 5F are views schematically illustrating an example of the process drawings for manufacturing the nitride-based semiconductor light emitting element according to the embodiment.
Figure 5D:
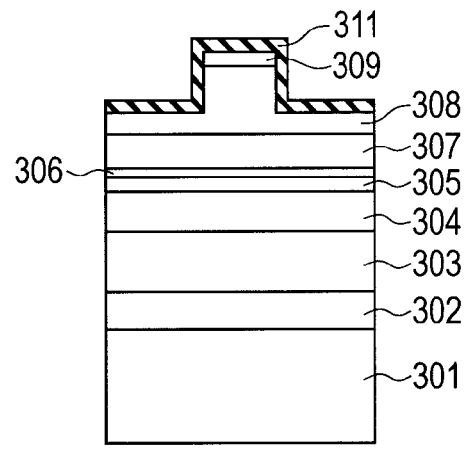

After placed into a growth system, the n-type GaN substrate 301 was heated while $NH_3$ was being supplied, so that the growth was initiated when the temperature reached the growth temperature. That is, as illustrated in FIG. 5A, On the n-type GaN substrate 301, the Si-doped n-type GaN layer 302 (Si concentration of $4\times10^{17}$ cm$^{-3}$, thickness of 1 μm), the n-type cladding layer 303 composed of Si-doped n-type $Al_{0.1}Ga_{0.9}N$ (Si concentration of $4\times10^{17}$ cm$^{-3}$, thickness of 2 μm), the n-type optical confinement layer 304 composed of Si-doped n-type GaN layer (Si concentration of $4\times10^{17}$ cm$^{-3}$, thickness of 0.1 μm), the three-cycle multiple quantum well (MQW) active layer 305 composed of an $In_{0.15}Ga_{0.85}N$ (thickness of 3 nm) well layer and Si-doped $In_{0.01}Ga_{0.99}N$ (Si concentration of $1\times10^{18}$ $cm^{-3}$, thickness of 4 nm) barrier layer, the cap layer 306 composed of Mg-doped p-type $Al_{0.2}Ga_{0.8}N$ (Mg concentration of $2\times10^{19}$ $cm^{-3}$, thickness of 10 nm), the p-type GaN optical confinement layer 307 composed of Mg-doped p-type GaN (Mg concentration of $2\times10^{19}$ $cm^{-3}$, thickness of 0.1 μm), the P-type cladding layer 308 composed of Mg-doped p-type $Al_{0.1}Ga_{0.9}N$ (Mg concentration of $1\times10^{19}$ $cm^{-3}$, thickness of 0.8 μm), and the P-type GaN contact layer 309 composed of Mg-doped p-type GaN (Mg concentration of $1\times10^{20}$ $cm^{-3}$, thickness of 20 nm), were sequentially deposited.

The GaN growth was performed on the conditions that the substrate temperature was 1080° C., the TMG supply amount was 58 μmol/min, and the NH3 supply amount was 0.36 mol/min. The AlGaN growth was performed on the conditions that the substrate temperature was 1080° C., the TMA supply amount was 36 μmol/min, the TMG supply amount was 58 μmol/min, and the $NH_3$ supply mount was 0.36 mol/min. And, the InGaN growth was performed on the conditions that the substrate temperature was 800° C., the TMG supply amount was 8 μmol/min, the $NH_3$ supply amount was 0.36 mol/min, and the TMI supply amount was 48 μmol/min for the well layer and 3 μmol/min for the barrier layer.

Figure 5B:
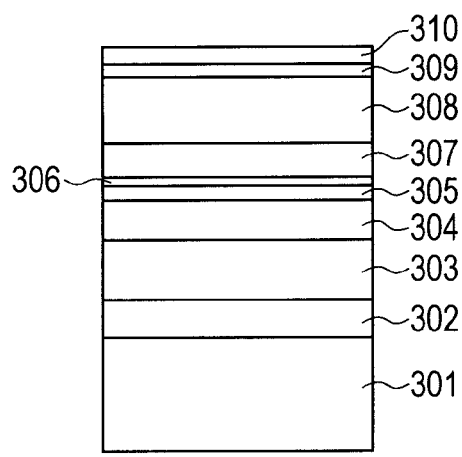
Figure 5E:
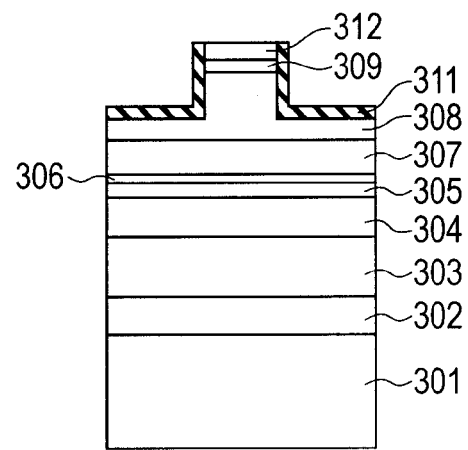
Figure 5C:
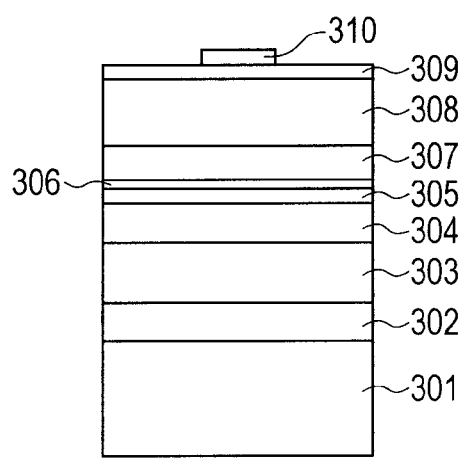
Figure 5F:
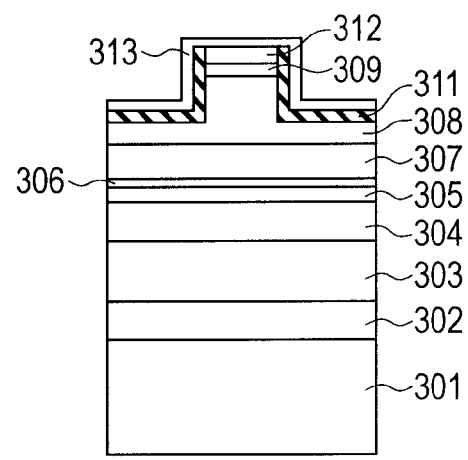

On the laminated body manufactured as described above, the $SiO_2$ film 310 was formed as illustrated in FIG. 5B, followed by the formation of the stripe-shaped $SiO_2$ film 310 with a width of 1.3 μm by photolithography, as illustrated in FIG. 5C.

Thereafter, parts of the p-type cladding layer 308 and the p-type GaN contact layer 309 were removed by dry etching using the stripe-shaped $SiO_2$ film 310 as a mask, thereby forming a ridge structure as illustrated in FIG. 5C. The stripe-shaped $SiO_2$ film 310 was then removed to newly deposit the $SiO_2$ film 311 on the whole surface, thereby obtaining the structure illustrated in FIG. 5D.

Subsequently, after a resist (not illustrated) was thickly coated on the $SiO_2$ film 311, the resist on the top of the ridge structure was removed by etch back in oxygen plasma. Thereafter, the $SiO_2$ film 311 on the top of the ridge structure was removed with buffered hydrofluoric acid followed by deposition of Pd/Pt by electron beam. After the p-contact 312, excluding Pd/Pt on the top of the ridge structure, was formed by a liftoff method, RTA (Rapid Thermal Annealing) was performed in a nitrogen atmosphere at 600° C. for 30 seconds, thereby forming a p-ohmic electrode.

Subsequently, a Ti film with a thickness of 50 nm, a Pt film with a thickness of 100 nm, and an Au film with a thickness of 2 μm, were deposited thereon by sputtering, thereby forming the p-type cover electrode 313. Also, the back surface (wafer back surface) of the laminated body was polished such that the thickness of the wafer was made as small as 100 μm, and then a Ti film with a thickness of 5 nm, an Al film of a thickness of 20 nm, a Ti film with a thickness of 10 nm, and an Au film with a thickness of 500 nm, were vacuum-deposited in this order, thereby forming the n-type electrode (not illustrated).

Subsequently, the wafer in which the electrodes had been formed was cleaved in the direction perpendicular to the stripe to form a laser bar with a resonator length of 400 μm.

Subsequently, the dielectric film 201 was formed on the end surface of the laminated body manufactured by the aforementioned method. Specifically, a film composed of $SiO_2$ was deposited on the surface of the laminated body on the side where a laser beam was to be radiated by using an RF (Radio Frequency) magnetron sputtering system. The dielectric films 201 were manufactured so as to have five film thickness levels of 0.2 μm, 1 μm, 2 μm, 3 μm, and 6 μm.

After the dielectric film 201 was formed, the laminated body on which the dielectric film 201 had been formed was once removed from the system, and subsequently the HR film with a reflectance of 90% composed of $SiO_2/TiO_2$ was formed on the surface opposite to the surface where the dielectric film 201 was formed, by using the RF magnetron sputtering system again. Subsequently, a laser chip (nitride-based semiconductor light emitting element) with an element width of 200 μm was manufactured by element isolation.

<<Test 1>>

The laser chip obtained by the aforementioned processes was fusion-bonded to an Si heatsink with silver paste, and the heatsink was further fusion-bonded to a frame package with silver paste to obtain a laser element. These laser elements were incorporated into the commercially available optical disk apparatuses, which were then placed into a thermostatic chamber whose temperature was maintained at 80° C. to perform the APC (Auto Power Control) test. The inside of the thermostatic chamber was made to be under air atmosphere. The laser outputs of the APC test were set to five levels of 0.3 mW, 1 mW, 3 mW, 10 mW, and 20 mW, and the laser was driven by CW (Continuous Wave). In semiconductor laser elements, $\theta_V$ thereof is generally distributed due to variations in manufacturing them. In the APC test, a group of selected elements were used such that $\theta_V$ was uniformly distributed within a range of 15° to 25° for each test level.

Figure 6:
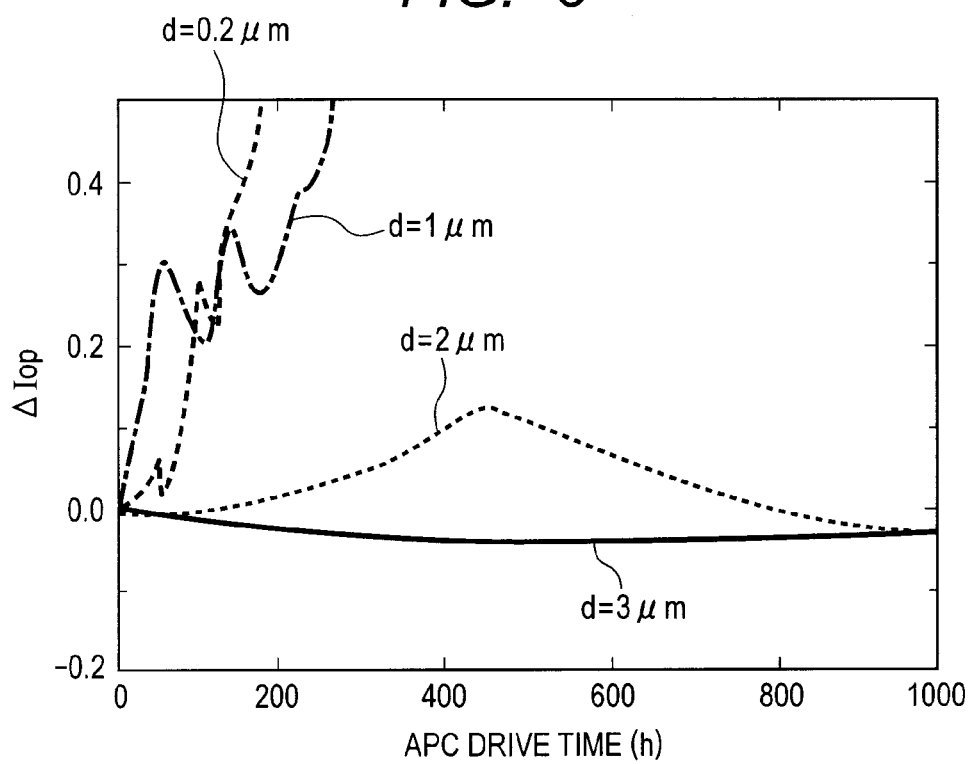
FIG. 6 is a graph illustrating a temporal change in $\Delta I_{OP}$ in the APC test of the nitride-based semiconductor light emitting element.
Figure 7:
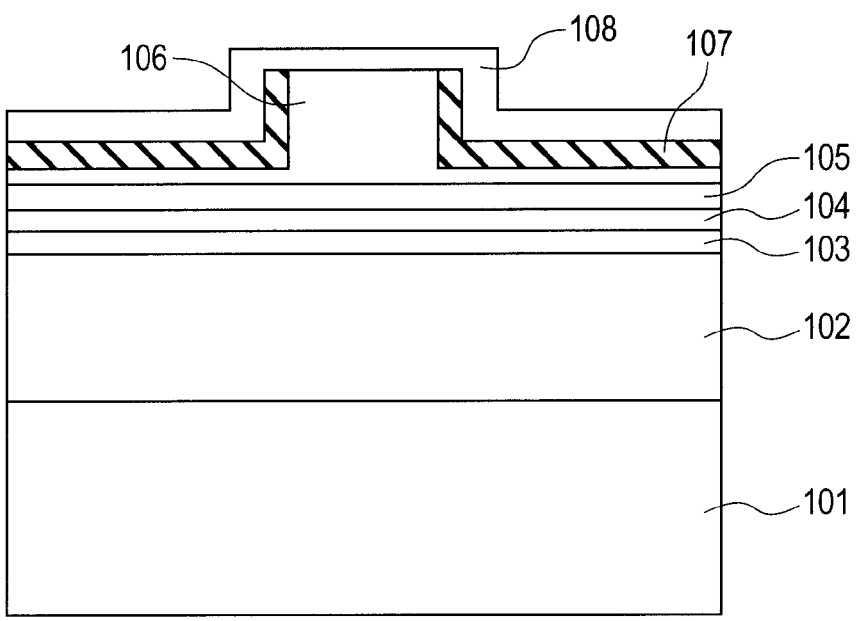
FIG. 7 is a sectional view schematically illustrating an example of a general nitride-based semiconductor light emitting element.

FIG. 6 is a graph illustrating a temporal change in an operating current when the thickness d of the dielectric film 201 was changed. The light output was set to 10 mW. The laser output during a reproduction operation in typical optical disks is smaller than or equal to 5 mW, and accordingly the output level of the present test fully covers the typical use condition. In FIG. 6, $\Delta I_{OP}$ represents an amplitude variation $\Delta I_{OP} = (I_{OP} - I_{OPO})/I_{OPO}$, assuming that the operating current at each time is $I_{OP}$ and the operating current at the start of the APC test is $I_{OPO}$.

As clearly shown from FIG. 6, the laser elements with the thickness d of the dielectric film 201 of 0.2 μm and 1 μm were increased in operating current, with oscillation being involved, as a period of the APC test elapsed. After the APC test, the laser element was taken out to observe the light-radiating surface. As a result of the observation, it was found that black foreign substance adhered to the laser beam radiation-area. The composition of the adherent substance was estimated by an EDX (Energy Dispersive X-ray spectrometry), and it was found that the substance was composed of $SiO_X$. Thereby, it can be estimated that silicon organic gas was present in the optical disk apparatus and the adherent substance, which had been produced with the silicon organic gas being degraded by a laser beam, accumulated thereon.

On the other hand, in the laser element with the thickness d of the dielectric film 201 of 2 μm, there was observed oscillation of the operating current. The oscillation became large, in particular, when 400 hours elapsed.

In contrast, in the laser element with the thickness d of the dielectric film 201 of 3 μm, there was not observed an oscillating structure for up to 1000 hours, and also the amplitude of $\Delta I_{OP}$ was as small as 8%. There will be no practical problem in terms of reliability when $\Delta I_{OP} < 30\%$ after 1000 hours have elapsed, which is completely satisfied in this laser element.

On the other hand, in the test in which the thickness d of the dielectric film 201 was set to 6 μm (not illustrated in FIG. 6), a disturbance was observed in the initial vertical radiation pattern with the element whose $\theta_V$ exceeded 19°. Assuming that h=0.9 μm, h·cot (θ$_v$/2) is 5.4 μm when θ$_v$=20°, and hence the light field of these laser elements covers the top surface of the chip, and accordingly it can be considered that a disturbance arose in the radiating patter.

<<Test 2>>

The APC test of the laser elements with the thickness d of the dielectric film 201 of 2 μm and 3 μm, the laser elements being manufactured by the same means as Test 1, was performed when the light output was changed to 0.3 mW, 1 mW, 3 mW, 10 mW, and 20 mW. ΔI$_{OP}$ after 1000 hours of drive at each test level is shown in Table 1.

TABLE 1

| Output (mW) | ΔI$_{op}$@100 h d = 2 μm | ΔI$_{op}$@100 h d = 3 μm |
|---|---|---|
| 0.3 | 2.9% | 1.3% |
| 1 | 3.1% | 1.5% |
| 3 | 3.9% | 2.1% |
| 10 | >30% | 13% |
| 20 | >30% | 22% |

Under the condition of the light output being 3 mW or less, the test result has been obtained that each of the laser elements with the thickness d of the dielectric film 201 of 2 μm and 3 μm had ΔI$_{OP}$ within a range of 4% for a test period of 1000 hours. As stated above, because the reaction rate of a photochemical degradation is proportional to the square of a light output, the reaction rate occurring when the light output is 3 mW or less is reduced to one-tenth or less of that occurring when the light output is 10 mW. Accordingly, the above result can be understood from this estimation.

On the other hand, under the condition of the light output being 20 mW and in the laser element with the thickness d of 2 μm, it has been learned that the oscillation cycle of the operating current is approximately 130 hours, which is shorter than that occurring when the light output is 10 mW, and ΔI$_{OP}$ exceeds 30% when 600 hours have elapsed.

In contrast, in the laser element with the thickness d of 3 μm, it has been demonstrated that ΔI$_{OP}$ is smaller than or equal to 22% when 1000 hours have elapsed and enough reliability is achieved even when a light output is 20 mW.

What is claimed is:

1. A nitride-based semiconductor light emitting element comprising:
    a laminated body including a first cladding layer, an active layer formed over the first cladding layer, and a second cladding layer formed over the active layer; and
    a dielectric film with a thickness of 3 μm or more that is formed on the side surface of the laminated body on the side where light is emitted and that covers at least a first side surface of the active layer,
    wherein, assuming that the distance from the upper side of the first side surface of the active layer to the top of the side surface of the dielectric film, in the direction approximately perpendicular to the active layer, is h, and the radiation angle of the light radiated from the first side surface of the active layer in the direction approximately perpendicular to the active layer, is θ$_v$, the thickness of the dielectric film is smaller than or equal to h·cot (θ$_v$/2).

2. The nitride-based semiconductor light emitting element according to claim 1,
    wherein the dielectric film is: a film composed of any one of Al$_2$O$_3$, SiO$_2$, TiO$_2$, ZrO$_2$, Ta$_2$O$_5$, Nb$_2$O$_5$, MgF$_2$, CaF$_2$, AlN, Si$_3$N$_4$, and a silicone resin; or a multilayer film combining two or more of the foregoing films.

3. A light emitting device in which the nitride-based semiconductor light emitting element of claim 1 is packaged.

4. The light emitting device according to claim 3, wherein the nitride-based semiconductor light emitting element is mounted in a frame package.

* * * * *